United States Patent [19]

Socha

[11] Patent Number: 5,600,102

[45] Date of Patent: Feb. 4, 1997

[54] SOLDER PREFORM WRAPPABLE AROUND A PRINTED CIRCUIT CARD EDGE

[75] Inventor: Paul A. Socha, Whitesboro, N.Y.

[73] Assignee: Indium Corporation of America, Utica, N.Y.

[21] Appl. No.: 607,795

[22] Filed: Feb. 27, 1996

[51] Int. Cl.[6] .................................................. H05K 1/02
[52] U.S. Cl. .............................. 174/261; 439/62; 439/59; 439/84; 29/843; 29/844
[58] Field of Search ................................ 439/62, 59, 60, 439/61, 83, 84; 174/260, 261; 29/842, 843, 844

[56] References Cited

U.S. PATENT DOCUMENTS

| | | | |
|---|---|---|---|
| 3,750,265 | 8/1973 | Cushman | 29/471.3 |
| 3,931,719 | 1/1976 | Schwab | 63/28 |
| 3,932,934 | 1/1976 | Lynch et al. | 29/628 |
| 4,050,621 | 9/1977 | Bouley | 228/247 |
| 4,216,350 | 8/1980 | Reid | 174/68.5 |
| 4,328,921 | 5/1982 | Liang | 228/222 |
| 4,336,639 | 6/1982 | Berglund | 29/25.35 |
| 4,341,921 | 7/1982 | Simpson | 174/84 R |
| 4,372,037 | 2/1983 | Scapple et al. | 29/613 |
| 4,557,411 | 12/1985 | Farquharson et al. | 228/56.3 |
| 4,737,115 | 4/1988 | Seidler | 439/83 |
| 4,738,625 | 4/1988 | Burton et al. | 439/59 |
| 5,029,749 | 7/1991 | Lauterbach et al. | 228/180.1 |
| 5,167,511 | 12/1992 | Krajewski et al. | 439/61 |
| 5,205,738 | 4/1993 | Anderson, Jr. et al. | 439/59 |
| 5,242,097 | 9/1993 | Socha | 228/56.3 |
| 5,419,708 | 5/1995 | Koss et al. | 439/59 |
| 5,441,429 | 8/1995 | Seidler | 439/876 |
| 5,496,182 | 3/1996 | Yasumura | 439/62 |

Primary Examiner—Laura Thomas
Attorney, Agent, or Firm—Weingarten, Schurgin, Gagnebin & Hayes LLP

[57] ABSTRACT

An integral solder preform is disclosed for application to a printed circuit card having first and second sides, a first edge and first and second pluralities of conductive pads disposed on the respective first and second sides of the printed circuit card in respective first and second predetermined conductive pad arrangements. The integral solder preform has first and second pluralites of solder pads having respective first and second solder pad arrangements which are maintained in position by a plurality of bridging solder bands. The first and second solder pad arrangements correspond to the first and second predetermined conductive pad arrangements and are spaced apart by a predetermined distance by spacing solder bands. The printed circuit card is aligned over the spacing solder bands and the first and second solder pad arrangements are wrapped around the first edge such that the first and second solder pad pluralities of solder pads overlay respective first and second pluralities of conductive pads on the printed circuit card. A fixture which may be employed to facilitate the alignment of the solder preform for use with the solder preform is also disclosed.

10 Claims, 3 Drawing Sheets

SOLDER PREFORM WRAPPABLE AROUND A PRINTED CIRCUIT CARD EDGE

FIELD OF THE INVENTION

The present invention relates to solder preforms and in particular, to a solder preform for applying solder to conductive pads located on two sides of a printed circuit card.

BACKGROUND OF THE INVENTION

The use of solder preform is well known and a number of solder preforms have been developed to address specific application requirements. U.S. Pat. No. 5,242,079, which is assigned to the assignee of the present invention, describes a solder preform containing a series of islands that are joined together in a matrix by bridging bands. The bands have a reduced cross-sectional area in their mid-region. The islands may contain pin receiving holes and solder tabs arranged to frictionally engage a pin as it is passed through the hole to provide for pre-wetting of the pin and to promote flowing of the solder to the pins upon heating of the preform.

Other solder preforms are disclosed in U.S. Pat. Nos. 4,557,441, 4,050,621, 4,216,350. The known solder preforms are generally planer structures intended for use on a planer surface.

It would be desirable to have a solder preform particularly adapted for bonding to conductive pads located on two sides of a printed circuit card without the associated complexity involving with the alignment and mating of separate solder preforms. Additionally, it would be desirable to be able to employ a solder preform for the mounting of edge card connectors, such as straddle connectors, to a printed circuit card to provide manufacturing efficiencies and improve the reliability of the solder joints between straddle connector contacts and the corresponding conductive pads on the printed circuit card.

SUMMARY OF THE INVENTION

The present invention provides an integral solder preform for application to a printed circuit card having first and second sides, a first edge and first and second pluralities of conductive pads disposed on the respective first and second sides of the printed circuit card in respective first and second predetermined conductive pad arrangements. The integral solder preform has first and second pluralites of solder pads having respective first and second solder pad arrangements which are maintained in position by a plurality of bridging solder bands which are integral with the respective first and second pluralities of solder pads. The first and second solder pad arrangements correspond in layout to the first and second predetermined conductive pad arrangements and are spaced apart by a predetermined distance by spacing solder bands which are also integral with the first and second pluralites of solder pads.

The printed circuit card is aligned over the spacing solder bands and the first and second solder pad arrangements are wrapped around the first edge such that the first and second pluralities of solder pads overlay respective first and second pluralities of conductive pads on the printed circuit card.

In one embodiment, the solder preform is adapted for use with a straddle connector having first and second rows of connector contacts spaced apart within each row by a predetermined distance. The first plurality of conductive pads on the first side of the printed circuit card are disposed on the card adjacent the first edge and spaced apart in a first conductive pad arrangement corresponding to that of the first row of straddle connector contacts. Similarly, the second plurality of conductive pads on the second side of the printed circuit card are disposed on the card adjacent the first edge and spaced apart in a second conductive pad arrangement corresponding to that of the second row of straddle connector contacts. The solder preform has first and second solder pad arrangements, each comprising a plurality of solder pads corresponding to the conductive pad arrangements on the first and second sides of the printed circuit card. The first and second arrangements of solder pads are maintained in position by bridging solder bands and maintained in spaced relation with respect to one another by spacing solder bands with connect selected ones of the first plurality of solder pads to selected ones of the second plurality of solder pads. The solder preform is aligned and wrapped around the first edge of the printed circuit card and the first and second rows of straddle connector contacts are positioned over the respective solder preform pads. The solder preform is then heated above the solder reflow temperature to bond the first and second rows of straddle connector contacts to the respective first and second pluralities of conductive pads. During solder reflow, the bridging and spacing bands are broken so the solder preform does not cause an electrical short circuit between coductive pads.

A preform wrapping fixture may be employed to facilitate the alignment and wrapping of the solder preform around the edge of the printed circuit card.

BRIEF DESCRIPTION OF THE DRAWING

These and other features of the invention are more fully described in the following exemplary detailed description and the accompanying drawings of which.

DETAILED DESCRIPTION OF THE INVENTION

Figure 1:
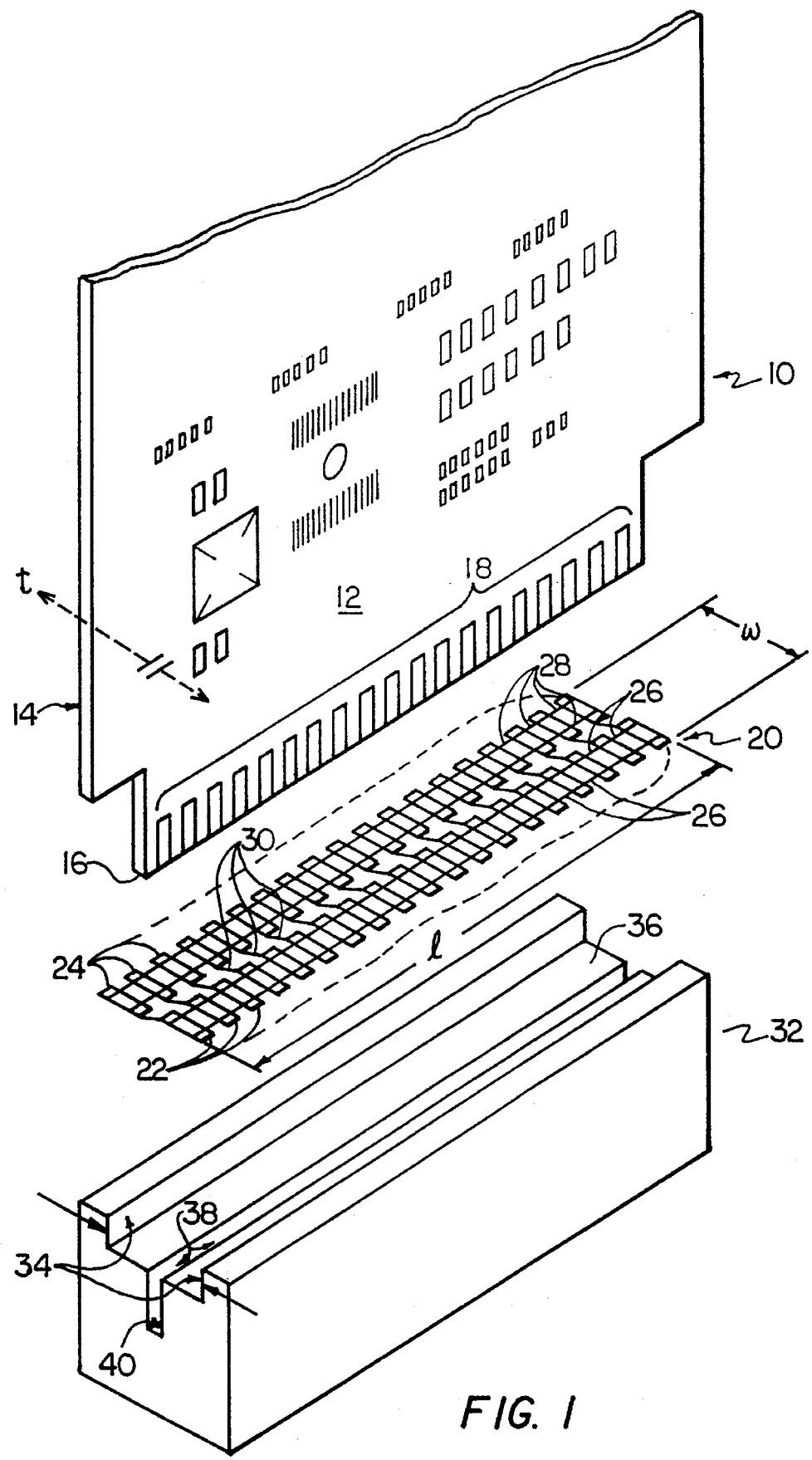
FIG. 1 is a perspective view illustrating a printed circuit card, a solder preform and a wrapping fixture in accordance with the present invention.

Referring to FIG. 1, a printed circuit card 10 is illustrated having a first side 12, a second side 14 and a first edge 16. The printed circuit card 10 has a thickness "t" between opposing first and second sides 12 and 14. A plurality of conductive pads or electrical contacts 18 are disposed on the first side 12 of the printed circuit card 10 and a second plurality of conductive pads or electrical contacts (not shown) are disposed on the second side 14 of the printed circuit card along the first edge 16 thereof.

An integral solder preform generally designated 20 has a first row of solder pads 22 and a second row of solder pads 24 which are sized and configured to overlay the first and second pluralities of conductive pads when the preform is wrapped around the first edge 16 of the printed circuit card 10.

More specifically, solder pads 22 are arranged in spaced relation corresponding to the arrangement of conductive pads 18 on the first side 12 of printed circuit card 10.

Similarly, the solder pads 24 are arranged in spaced relation corresponding to the arrangement of conductive pads on the second side 14 of the printed circuit card 10. The solder pads 22 and 24, though depicted in the present embodiment as generally rectangular solder pads, corresponding to the shape of conductive pads on the printed circuit card 10, may be of any suitable shape and typically correspond in shape to that of the associated conductive pad on the printed circuit card. The first and second pluralities of solder pads 22 and 24 are maintained in spaced relation via respective bridging solder bands 26 and 28 which are integral with the solder pads. The first and second pluralities of solder pads 22 and 24, in the present embodiment, are spaced apart by a distance approximately equal to the thickness t of the printed circuit card 10 by spacing solder bands 30. Consequently, the preform 20 may be wrapped around the first edge 16 of the printed circuit card 10 and aligned such that the respective solder pads 22 and 24 align with and overlay the conductive pads disposed along the first edge of the printed circuit card on both the first and second sides thereof.

As disclosed in U.S. Pat. No. 5,242,097 the bridging solder bands and the spacing solder bands may have a reduced cross section in the mid-region of the respective bands to promote the separation of the band at the location of the reduced cross section upon heating of the solder preform to a temperature above the solder reflow temperature.

The conductive pads, may be disposed on the printed circuit card in varying patterns based upon specific application requirements and the solder preform in accordance with the present invention adapted for such varying patterns. For example, when the solder preform is adapted for use with a straddle connector having electrical contacts which directly oppose one another, the solder preform will have solder pads which are arranged such that the pads will oppose one another when properly aligned and wrapped around the first edge 16 of the circuit card 10. Similarly, if the straddle connector has electrical contacts with rows of opposing contacts offset from one another, the conductive pads on the printed circuit card will have a corresponding offset as will the corresponding solder pads of the solder preform 20. It is thus apparent that a single solder preform may be employed for bonding electrical contacts of a straddle connector to conductive pads on first and second sides of a printed circuit card. It is further evident that a solder preform in accordance with the present invention may be employed in any circumstance in which it is desireable to reflow solder to a plurality of conductive pads disposed on opposing sides of a printed circuit card. The solder preform in accordance with the present invention may be fabricated of alloys such as tin lead, tin lead silvers, tin silver, bismuth tin or any other suitable alloy and may be formed by etching, stamping or any other suitable forming technique.

The presently disclosed integral solder preform has a width W and a length L as illustrated in FIG. 1. A fixture 32 for facilitating the alignment of the solder pads 22 and 24 with corresponding conductive pads 18 and second side conductive pads (not shown) and for deforming the solder preform around the first edge 16 of the printed circuit card 10 is also shown in FIG. 1. The fixture 32 has a channel defined by interior surfaces 34 and lower channel surface 36. The interior channel surfaces 34 define a width which is selected to permit the solder preform 20 to be disposed between the respective interior wall surfaces 34. The fixture 32 further includes a slot defined by slot walls 38 and a slot floor 40. The slot is located such that the spacing solder bands 30 are disposed at least partially over the slot when the solder preform 20 is positioned in the channel of the fixture 32.

More specifically, the solder preform 20 is positioned within the channel of the fixture 32 and the first edge 16 of the printed circuit card 10 is inserted into the slot within the fixture thereby deforming the solder preform 20 and causing the solder preform 20 to wrap around the edge 16 of the printed circuit card 10 with solder pads overlaying corresponding conductive pads on the printed circuit card. Following the insertion of the printed circuit card 10 into the slot of the fixture 32 the solder preform 20 exhibits the shape illustrated in FIG. 2.

Figure 2:
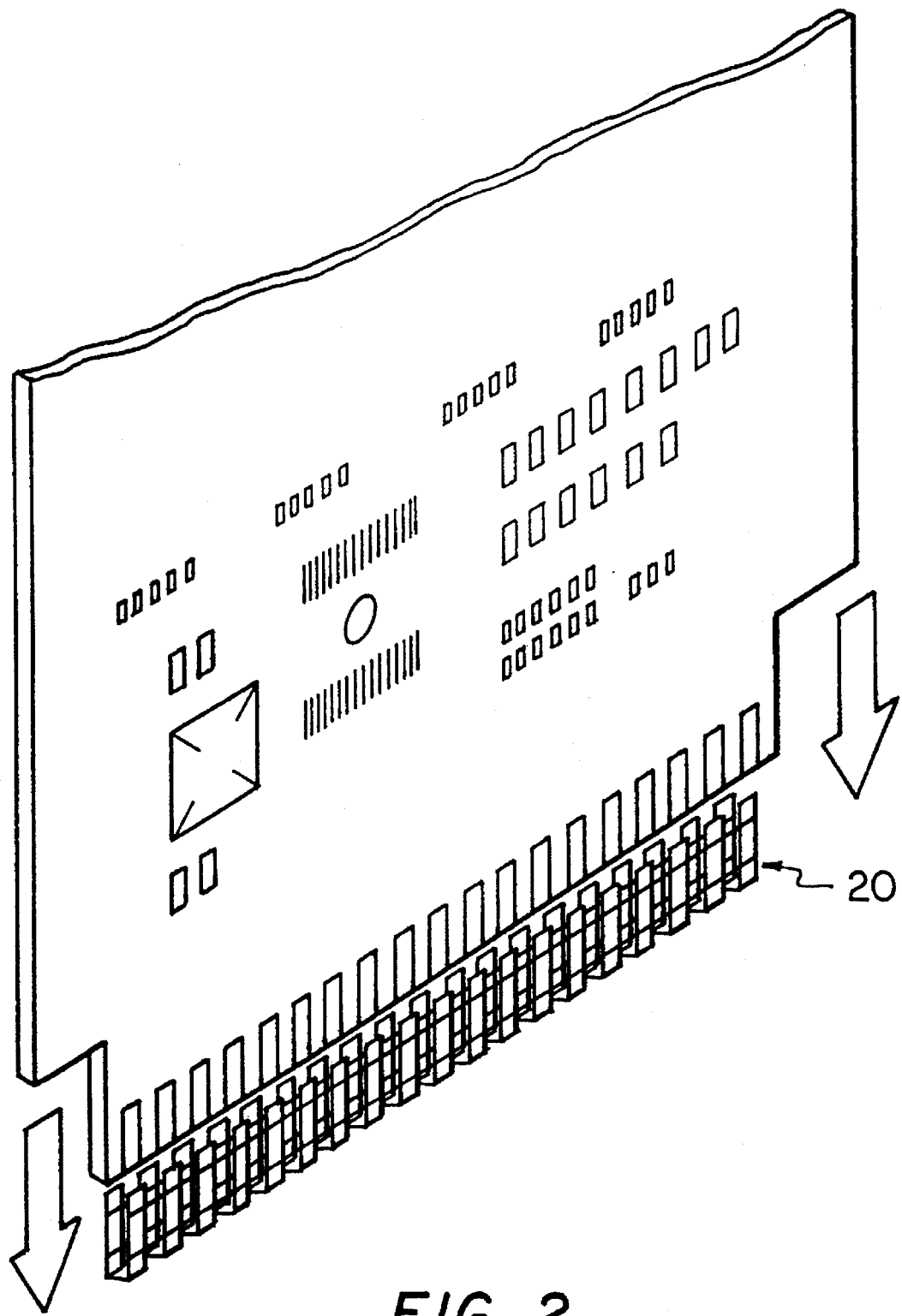
FIG. 2 is a perspective view illustrating the use of the solder preform of the present invention in conjunction with the printed circuit card of FIG. 1.

As shown in FIG. 2, since the first and second rows of solder pads in the solder preform 20 are spaced apart approximately by the distance t, once the solder preform 20 is wrapped around the edge 16 of the printed circuit card 10 the solder pads 22 and 24 align with the electrical contacts on the first and second sides of the printed circuit card. The solder preform 20 may be retained in alignment with solder pads overlaying corresponding conductive pads by use of a suitable flux or adhesive.

Figure 3:
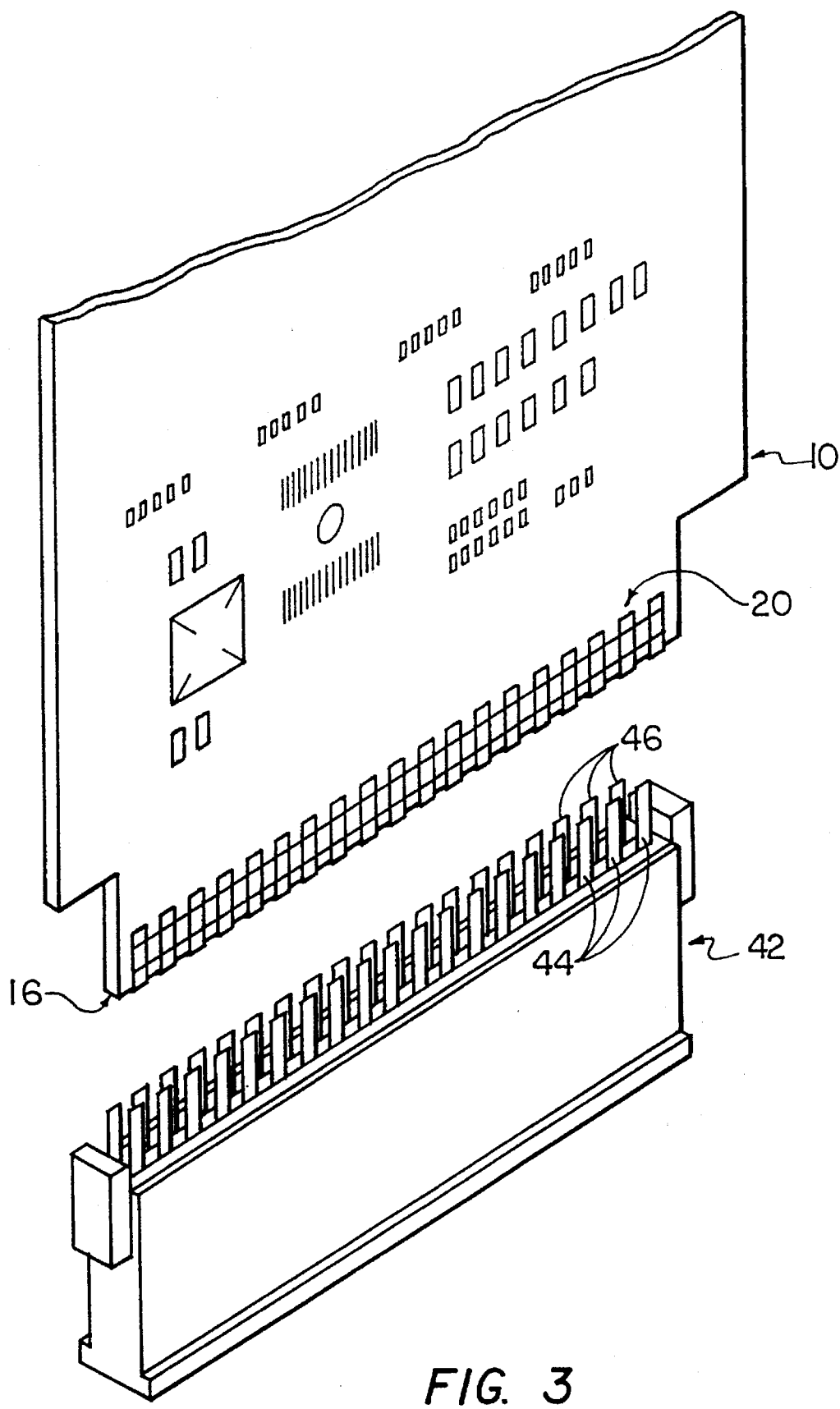
FIG. 3 is a perspective view showing the solder preform aligned over conductive pads of the printed circuit card and a straddle connector intended for mating to the condcutive pads of the printed circuit card.

Referring to FIG. 3, a straddle connector 42 is illustrated having first and second rows of electrical contacts 44 and 46 intended to mate with the conductive pads on the first and second sides of the printed circuit card 10. The straddle connector 42 may have either male (not shown) or female (not shown) contacts for use with a mating connector such as a PCMIA connector.

After the solder preform 20 is wrapped around the first edge 16 of the printed circuit card 10 and aligned with first and second pluralities of solder pads 22 and 24 overlaying corresponding conductive pads on the printed circuit card, the first and second rows 44 and 46 of electrical contacts of the straddle connector 42 are disposed over corresponding solder pads of the solder preform 20 such that the straddle connector electrical contacts 44 and 46 abut the respective solder pads of the solder preform.

The solder preform 20, conductive pads of the printed circuit card 10 and electrical contacts of the straddle connector 42 are then heated via any well known bulk heating technique, such as by use of a convection oven, an infrared oven, vapor phase heating, a heat gun or any other suitable source of heat such that the temperature of the solder preform 20 equals or exceeds the solder reflow temperature. The solder preform reflows once the solder reflow temperature is reached or exceeded causing the straddle connector contacts to bond to respective conductive pads on the first and second sides of the printed circuit card 10. Upon reflow of the solder preform, the bridging solder bands and the spacing solder bands agglomerate with solder disposed on the conductive pads associated with the respective solder pads so as to electrically isolate respective conductive pads and electrically decouple straddle connector contacts which would otherwise be electrically coupled by the bridging and spacing solder bands.

It is anticipated that other variations and adaptations of the disclosed embodiments will be apparent to those of ordinary skill in the art based upon the foregoing disclosure. Accordingly, the invention is not to be viewed as limited to the specifically disclosed embodiments but should rather, should only be viewed as limited by the scope and spirit of the appended claims.

What is claimed is:

1. A solder preform for use with a printed circuit card having first and second sides, a first edge, a first pattern of conductive pads disposed on said first side of said printed circuit card and a second pattern of conductive pads disposed on said second side of said circuit card, said solder preform comprising:

a first array of solder pads arranged in a first solder pad pattern corresponding to said first pattern of conductive pads on said first side of said printed circuit card;

a first plurality of bridging solder bands connecting selected ones of said first array of solder pads to maintain said first array of solder pads in said first solder pad pattern;

a second array of solder pads arranged in a second solder pad pattern corresponding to said second pattern of conductive pads on said second side of said circuit card;

a second plurality of bridging solder bands connecting selected ones of said second array of solder pads to maintain said second array of solder pads in said second solder pad pattern; and a plurality of spacing solder bands interconnecting selected ones of said first array of solder pads with selected ones of said second array of solder pads to form an integral solder preform, said first array of solder pads being arranged to overlay said plurality of conductive pads on said first side of said printed circuit and said second array of solder pads being arranged to overlay said plurality of conductive pads on said second side of said printed circuit card when said solder preform is wrapped around said first edge of said printed circuit card.

2. The solder preform of claim 1 wherein said printed circuit card has a thickness t, said first pattern of conductive pads on said first side of said printed circuit card comprises a first plurality of conductive pads spaced apart by a first predetermined distance and disposed on said printed circuit card adjacent said first edge of said printed circuit card and said second pattern of conductive pads comprises a second plurality of conductive pads on said second side of said circuit card spaced apart by a second predetermined distance and disposed on said printed circuit card adjacent said first edge of said printed circuit card and wherein said spacing bands maintain said first array of solder pads spaced apart from said second array of solder pads by a distance approximately equal to t such that said first and second plurality of solder pads overly said first and second pluralities of conductive pads upon wrapping said solder preform around said first edge of said printed circuit card.

3. The solder preform of claim 2 wherein each of the solder pads in the first array of solder pads is spaced a first predetermined distance from each adjacent solder pad in said first array and wherein each of the solder pads in the second array of solder pads is spaced a second predetermined distance from each adjacent solder pad in said second array.

4. The solder preform of claim 3 wherein said first predetermined distance equals said second predetermined distance.

5. A method for applying a solder preform to a printed circuit card having first and second sides, a first edge, a first plurality of conductive pads disposed on said first side of said printed circuit card in a first predetermined conductive pad pattern and a second plurality of conductive pads disposed said second side of said printed circuit card in a second predetermined conductive pad pattern, said method comprising the steps of:

aligning said printed circuit card with a solder preform having:

a first plurality of solder pads arranged in a first solder pad pattern corresponding to said first predetermined conductive pad pattern;

a second plurality of solder pads arranged in a second solder pad pattern corresponding to said second predetermined conductive pad pattern;

said first and second pluralities of solder pads being maintained in respective first and second solder pad patterns by respective first and second pluralities of bridging solder bands and said first and second solder pad patterns being maintained in spaced relation with respect to one another by a plurality of spacing solder bands interconnecting selected ones of the solder pads in said first plurality of solder pads with selected ones of said solder pads in said second plurality of solder pads;

wrapping said solder preform around said first edge of said printed circuit card such that said first plurality of solder pads overlays corresponding conductive pads of said first plurality of conductive pads, and said second plurality of solder pads overlays corresponding conductive pads of said second plurality of conductive pads on said second side of said printed circuit card.

6. The method of claim 5 wherein said wrapping step further comprises the steps of:

aligning said solder preform in a channel of a fixture, wherein said channel is defined by first and second opposing wall surfaces and lower channel surface and wherein said fixture further includes a slot extending below said lower channel surface and parallel to said channel, said slot having a width defined by first and second opposing slot walls and a slot lower surface, said solder preform being positioned within said channel following said aligning step such that said spacing solder bands are disposed over said slot;

inserting the first edge of said printed circuit card into said slot to deform said solder preform such that said first and second pluralities of solder pads overlay respective first and second pluralities of conductive pads.

7. The method of claim 5 further comprising the step of:

positioning first and second rows of electrical contacts of a straddle connector in abutting relation with respective first and second pluralities of solder pads on respective first and second sides of said printed circuit card.

8. The method of claim 7 wherein said solder preform has a solder reflow temperature and further comprising the step of heating said solder preform to a temperature in excess of said solder reflow temperature.

9. The method of claim 8 further comprising the step of heating said solder preform to cause the bridging solder bands and the spacing solder bands to agglomerate on adjacent conductive pads of said printed circuit card.

10. A solder preform for use with a printed circuit card having first and second patterns of conductive pads disposed on respective opposite sides of the card, said solder preform comprising:

a first and second array of solder pads each arranged in a solder pad pattern respectively corresponding to the first and second patterns of conductive pads on the card;

a first and second plurality of bridging solder bands each connecting the solder pads of the respective first and second arrays of solder pads to maintain the solder pads in the first and second patterns of solder pads;

a plurality of spacing solder bands interconnecting selected ones of said first array of solder pads with selected ones of said second array of solder pads to form an integral solder preform, said first array of solder pads being arranged to overlay said plurality of conductive pads on said first side of said printed circuit and said second array of solder pads being arranged to overlay said plurality of conductive pads on said second side of said printed circuit card when said solder preform is provided in a generally U-shaped form having first and second legs wherein said first and second array or solder pads comprise respectively, the first and second legs of said U-shaped form.

* * * * *